United States Patent [19]

Bell et al.

[11] Patent Number: 4,836,979

[45] Date of Patent: Jun. 6, 1989

[54] MANUFACTURE OF COMPOSITE STRUCTURES

[75] Inventors: James A. E. Bell; Thijs Eerkes, both of Oakville; Carlos M. Diaz, Mississagua, all of Canada; William L. Mankins, Huntington, W. Va.

[73] Assignee: Inco Limited, Toronto, Canada

[21] Appl. No.: 206,305

[22] Filed: Jun. 14, 1988

[51] Int. Cl.⁴ .............................................. G22F 3/24
[52] U.S. Cl. ...................................... 419/23; 75/246; 75/247; 419/28; 419/31; 419/32; 419/43
[58] Field of Search .................. 75/246, 247; 419/23, 419/28, 43, 31, 32

[56] References Cited

U.S. PATENT DOCUMENTS

| | | | |
|---|---|---|---|
| 521,992 | 6/1894 | Sachs et al. | 428/570 |
| 1,986,197 | 1/1935 | Harshaw | 204/1 |
| 4,032,301 | 6/1977 | Hassler et al. | 428/567 |
| 4,283,464 | 8/1981 | Hascoe | 428/594 |
| 4,365,996 | 12/1982 | Melton et al. | 419/28 |
| 4,478,787 | 10/1984 | Nadkarni et al. | 419/28 |
| 4,594,217 | 6/1986 | Samal | 419/28 |
| 4,604,259 | 8/1986 | Whitman | 419/28 |
| 4,699,763 | 10/1987 | Sinharoy et al. | 419/28 |
| 4,762,559 | 8/1988 | Penrice et al. | 419/28 |

FOREIGN PATENT DOCUMENTS 1087423  10/1980  Canada .

*Primary Examiner*—Stephen J. Lechert, Jr.
*Attorney, Agent, or Firm*—Raymond J. Kenny; Francis J. Mulligan, Jr.

[57] ABSTRACT

A method of producing a composite material from a mixture of copper and a low coefficient of thermal expansion nickel-iron alloy (Invar) powder is disclosed wherein advantageously at least part of the copper is deposited on the Invar powder prior to processing. Processing includes cold compacting to a green strip or other configuration, annealing in the temperature range of 550°–750° C. and working the annealed material at a temperature in that range to high density.

12 Claims, No Drawings

MANUFACTURE OF COMPOSITE STRUCTURES

BACKGROUND OF THE INVENTION

The proliferation of new integrated circuit chip technologies has changed the requirements of printed circuit substrates in the electronics industry. In particular the use of leadless ceramic chip carriers results in 3 to 9 times higher packing density of operating components and the consequently more severe thermal management problems. Leadless ceramic chip carriers are designed to be surface mounted and the solder connecting the device to the printed circuit board is both an electrical and a mechanical connection. When these chip carriers are mounted on conventional circuit boards such as epoxy glass the mismatch in thermal expansion coefficients of the chip carrier and the board is significant. The chip carrier has a thermal coefficient of expansion (TCE) of about 6.4 ppm/°C. over the temperature range of −55° C. to 200° C. while the epoxy glass has a TCE of 16 ppm/°C. over the same temperature range. This high mismatch results in solder-joint stress failure during thermal cycling.

Moreover, the higher packaging density achievable with chip carriers generates more heat per unit area of printed circuit board. This heat must be dissipated to prevent high temperature failures in the devices. Conventional epoxy glass printed circuit board materials are thermal insulators and are not suitable in high packing density applications without separate provision for heat dissipation.

Several attempts to solve the problem have been made. Workers in the art have used a copper/iron-nickel alloy/copper sandwich construction as described in "Implementation of Surface Mount Technology in High Reliability Products", G. L. Horton, presented at National Electronic Packaging and Production Conference, NEPCON WEST, February 1987, Anaheim Convention Center, Anaheim, CA and in "Military Moves Headlong Into Surface Mounting", Special Report by Jerry Lyman, Electronics, July 10, 1986. In this configuration the TCE of the composite sandwich construction can be made to match the TCE of the leadless ceramic chip carrier, i.e. around 6.4 ppm/°C. This iron-nickel alloy (Invar, also sold as NILO TM 36 by Inco Alloys International, Inc.) in the center of the sandwich has a TCE of 1.6 ppm/°C. over the temperature range of −18° C. to 175° C. while that of the copper is 17 ppm/°C. By placing 20% of copper on each side of the core Invar, the TCE can be held to around 7 ppm/°C. over the aforespecified temperature range (unless otherwise stated thermal expansion mentioned hereinafter and in the claims are over this range of temperature).

However, this sandwich construction has one major drawback. While the copper has an excellent thermal conductivity of about 400 W/m.°C. the Invar has a thermal conductivity of only around 9.6 W/m.°C. This means that while the thermal conductivity along the strip is good, the conductivity through the strip is very poor. Thus the sandwich construction of copper/Invar/copper is not overly advantageous in advanced circuit board design.

Another approach to producing a material with controlled expansion properties and improved thermal conductivity through the sheet is described in U.S. Pat. No. 4,158,719 (the '719 patent). This patent teaches the blending of a highly thermal conductive powder such as copper with a controlled expansion alloy powder, compacting the blended powders, sintering at high temperature and cold rolling to produce a final product. All of the material in the '719 patent was sintered at a temperature of 982° C. or higher. The composite strip material produced by this process was designed for lead frames.

OBJECT

It is an objective of the present invention to substantially improve on the properties of the materials produced in the '719 patent.

It is a further objective of the present invention to provide a process for producing composite high conductivity (electrical and thermal) low thermal coefficient of expansion material which is readily controllable to provide a required combination of properties.

DESCRIPTION OF THE INVENTION

In its broadest sense, the present invention provides a process for producing a high conductivity low TCE composite in which a powder of copper, silver or copper-silver alloy and powdered nickel-iron alloy is compacted to form a green compact or strip, sintered for at least about 2 minutes in the temperature range of 550° C. to 750° C. and rolled at a temperature in that range to at least about 95% and advantageously to substantially 100% theoretical density. In its more advantageous aspect, the invention contemplates employing as powder, an iron-nickel alloy powder with particles at least about 44 micrometers in average dimension, having a deposit of copper, silver or copper-silver alloy on the surface of the particles in an amount of at least about 2% of the copper, silver or copper-silver alloy in the composite. The deposit of copper, for example, is generally made from a liquid containing the copper held at a temperature below about 110° C. While it is specifically within the contemplation of the invention to deposit copper or silver or alloys thereof onto powdered nickel-iron alloy from aqueous solution by electrodeposition, by chemical replacement plating (cementation) or by chemical reduction plating, applicants also contemplate deposition from organic solutions such as alcohols and glycols. Advantageously, for reasons of economy, copper is employed in the process of the present invention.

The nickel-iron component of the composite material made by the process of the present invention is advantageously Invar, an alloy containing about 36% nickel, balance essentially iron, together with usual amounts of impurities and incidental elements. However, low expansion alloys can be made over the range of about 32 to 40% by weight of nickel, balance iron, and other elements such as cobalt can be substituted for up to about 5% of the nickel. As has been known for a long time, the minimum in TCE exhibited by the 36% nickel, balance iron alloy can be shifted to higher nickel contents when manganese or chromium is present in the alloy and to lower nickel contents when copper or carbon is present in the alloy. Specifically the present invention contemplates use of any nickel-iron low TCE alloy powder including powders of alloys discussed by M. A. Hunter in the chapter on Low-Expansion Alloys, Metals Handbook, ASM, 8th Edition, Vol. 1, pp. 816-819. The powder comprises particles advantageously in the size range of 44 micrometers to 200 micrometers in average dimension.

Copper, in addition to that deposited on the nickel-iron alloy powder, is advantageously powder of electrical grade copper within the size range of 44 micrometers to 200 micrometers. The powder of the iron-nickel alloy and the copper can be made by standard techniques, e.g. by water atomization plus thermal reduction of the water atomized product, or can be purchased from commercial sources. Advantageously, the powders used in the process of the present invention are other than spherical.

The composite produced in accordance with the present invention can contain about 50 to about 80% by weight of iron-nickel low expansion alloy, balance essentially copper, silver or copper-silver alloy. While a third component might be included in the composite, it is generally considered that such a component would not be advantageous. Advantageously, the copper content of the composite is about 20% to 50% by weight and, more advantageously, about 35 to 50% by weight.

As mentioned hereinbefore, the present invention is characterized by annealing (or sintering) of green (cold pressed or cold rolled) powder compact in the range 550° C. to 750° C. Annealing is conveniently for about 10 minutes but can be as long as about 1 hour at 550° C. and as short as about 2 minutes at 750° C. Interdiffusion increases with increasing temperature and results in decreases in both electrical and thermal conductivity. Annealing is carried out in a mildly reducing or inert atmosphere such as cracked ammonia, 1 to 5% hydrogen, balance nitrogen, argon or the like. As soon as the hot annealed powder compact is removed from the annealing furnace, it is rolled or otherwise worked to high, e.g. >95% theoretical density. Those skilled in the art will appreciate that this working is not necessarily hot working in the sense of working at a temperature above the recrystallization temperature of the metal being worked. Because of the nature of the composite being produced, a temperature within the range of 550° C. to 750° C. can either be below the recrystallization temperature of both copper and the nickel-iron alloy or above the recrystallization temperature of copper and below or on the borderline of the recrystallization temperature of the nickel-iron alloy.

In order to give a greater appreciation of the advantages of the invention, the following Examples are given:

EXAMPLE I

Fifteen parts by weight of 36% nickel, balance iron (Invar) powder of about 75 to 150 micrometers average particle size were added to a stirred reaction vessel at 50° C. containing 4000 parts by volume of an aqueous solution containing 40 parts by weight $CuSO_4.5H_2O$, 80 parts by weight $Na_4EDTA$, 40 parts by weight NaOH and 80 parts by volume of an aqueous solution containing 37 parts by weight of formaldehyde.

The stirring was continued for 1 hour at which time the light blue color of the solution had disappeared.

The resultant solid powder was decanted, washed, dried and analyzed. It contained 40 wt. % copper. This procedure was repeated until approximately 450 grams of copper-plated Invar powder was obtained. This plated powder was cold rolled between two opposing 8 inch diameter rolls, 2 inches in width to produce a green strip or compact. This green compact was then annealed at the temperature indicated in Table 1 for 10 minutes in a reducing atmosphere and immediately rolled at or about the temperature of annealing. The properties of the product are set forth in Table 1.

TABLE 1

| Annealing Temp., °C. | Electrical Resistivity ohm · cm × $10^{31\ 6}$ | Coefficient of Thermal Expansion |
| --- | --- | --- |
| 650 | 6.4 | 7.2 |
| 750 | 7.0 | — |

EXAMPLE II

Fifty parts by weight of Invar powder (36% Ni, balance Fe), was agitated at room temperature in a solution containing 400 volumes of water and 20 volumes of $H_2SO_4$. An aqueous solution containing 175 parts by weight of $CuSO_4.5H_2O$ per 1000 volumes was added at a rate of 7 volumes/min. until the resultant Invar coated with copper by cementation contained 5, 10 or 15 wt. % copper. The resultant copper-coated Invar was decanted, washed and dried. Copper powder of the same size as the Invar powder was added to either the 5, 10 or 15 wt. % copper-plated Invar so the sum total of the mixture was 40 wt. % copper. The powders were then thoroughly blended. Each size range as well as the rolling temperature was also varied. The results are shown in Table 2 along with copper-Invar powder blends in which no copper was cemented on the Invar.

TABLE 2

ROOM TEMPERATURE RESISTIVITY OF 40% CU-INVAR COMPOSITES

| % Cu Cemented | Particle Size Range (micrometers) | Temperature °C. | | | |
| --- | --- | --- | --- | --- | --- |
| | | 600 | 650 | 750 | 850 |
| | | (micro ohm · cm) | | | |
| 0 | 150–200 | 10.2 | 9.6 | 9.3 | 9.6. |
| 0 | 75–150 | 7.9 | 8.7 | 7.9 | 8.4 |
| 0 | 44–75 | — | 8.0 | 8.6 | 11.3 |
| 5 | 150–200 | 9.0 | 8.7 | 9.6 | 10.9 |
| 5 | 75–150 | 8.1 | 7.3 | 7.9 | 9.9 |
| 5 | 44–75 | 7.5 | 7.7 | 8.9 | 12.4 |
| 10 | 150–200 | 7.8 | 8.3 | 9.0 | 12.0 |
| 10 | 75–150 | 7.3 | 7.6* | 8.7 | 10.4 |
| 10 | 44–75 | 7.7 | 7.7* | 8.6 | 14.3 |
| 15 | 150–200 | 7.7 | 7.9 | 8.9 | — |
| 15 | 75–150 | 7.3 | 8.1 | 7.9 | — |
| 15 | 44–75 | 8.3 | 7.7 | 9.1 | 13.9 |

*TCE values for these specimens are 7.6 and 6.7 ppm/°C. over the range of 145° C. to 35° C.

The results in Tables 1 and 2 show that the electrical resistivity of the composites is improved when some copper is cemented or plated on the Invar prior to consolidation, annealing in the range of 550° C. to 750° C. and co-rolling the annealed, consolidated compact at that temperature. With annealing at 650° C. the resistivity is lowered from 8.6 microohm centimeters for no cemented copper to 7.3 for 5% cemented copper on Invar. At the same annealing temperature for fully plated (40%) copper on Invar the resistivity is as low as 6.4 microohm centimeters. This lowered electrical resistivity is indicative of a corresponding increase in thermal conductivity and is quite significant in the field of high density, integrated circuit chip mounting. Almost uniformly, annealing at a temperature above 750° C. (i.e. 850° C.) resulted in a significantly higher room temperature resistivity.

The strength of some of the composites shown in Table 2 was measured by a 3 point bend test as described in ASTM B312-82. The strength of the composites as reported in Table 3, while somewhat variable due to the edge effects of the small strip, clearly demonstrates that the composites produced by cementing some copper on the Invar prior to co-rolling have superior strengths.

TABLE 3

3 PT BEND STRENGTH OF 40% CU-INVAR BALANCE COMPOSITES AS A FUNCTION OF ROLLING TEMPERATURE, PARTICL SIZE, AND PERCENT CU PREPLATED ON THE INVAR

| % Cu Plated | Particle Size Range (micrometers) | Temp. of Rolling °C. | | | |
|---|---|---|---|---|---|
| | | 600 | 650 | 750 | 850 |
| | | (MPa) | | | |
| 0 | 150-200 | 360 | 464 | 423 | 506 |
| 0 | 75-150 | 477 | 421 | 398 | 550 |
| 0 | 44-75 | — | 435 | 474 | 722 |
| 5 | 150-200 | 576 | 631 | 634 | 502 |
| 5 | 75-150 | 744 | 761 | 684 | 722 |
| 5 | 44-75 | 738 | 838 | 790 | 925 |
| 10 | 150-200 | — | 631 | 543 | 636 |
| 10 | 75-150 | 789 | 722 | 710 | 815 |
| 10 | 44-75 | 727 | 880 | 756 | 915 |
| 15 | 150-200 | 929 | 807 | 676 | — |
| 15 | 75-150 | 575 | 711 | 793 | — |
| 15 | 44-75 | 792 | 812 | 862 | 965 |

Again, although by rolling at a high temperature, i.e. 850° C., somewhat higher bend strengths are usually obtained, these higher strengths are gained with a significant sacrifice in electrical conductivity as shown in Table 2.

While in accordance with the provisions of the statute, there is illustrated and described herein specific embodiments of the invention, those skilled in the art will understand that changes may be made in the form of the invention covered by the claims and that certain features of the invention may sometimes be used to advantage without a corresponding use of the other features.

The embodiments of the invention in which an exclusive property or privilege is claimed are defined as follows:

1. A process for making a composite of a low expansion, high electrical and heat conductive material in which the low expansion component is a nickel-iron alloy and the high electrical and heat conductive material is selected from the group consisting of copper, silver and copper-silver alloys comprising:
    (a) producing a green compact of nickel-iron and a material selected from the group consisting of copper, silver, and copper-silver alloys of the chemical composition required for said composite;
    (b) heating said green compact for about 2 to about 60 minutes in a protective atmosphere at a temperature of about 550° C. to 750° C.; and
    (c) working the thus heated compact within said temperature range to at least about 95% theoretical density.

2. A process as in claim 1 wherein the material selected from said group is copper.

3. A process as in claim 1 wherein the composite contains about 20 to 50 weight percent copper, balance nickel-iron alloy containing about 32 to 40 weight percent nickel.

4. A process as in claim 1 wherein the metal powder employed in the process has an average particle size of about 44–200 micrometers.

5. A process as in claim 1 wherein the green compact and the final product are produced by rolling.

6. A process as in claim 1 wherein said protective atmosphere is a reducing atmosphere.

7. A process for making a composite low expansion, high electrical and heat conductive material in which the low expansion component is a nickel-iron alloy and the high electrical and heat conductive material is selected from the group consisting of copper, silver and copper-silver alloys comprising:
    (a) depositing at least about 2% of the material from the group consisting of copper, silver and copper-silver alloys in said composite from a liquid held at a temperature less than about 110° C. onto powder particles of said nickel-iron alloy at least about 44 micrometers in average dimension;
    (b) blending, if necessary, the product powder produced in step (a) with additional powder material, if any, of said group to provide powder of said composite chemical composition;
    (c) producing a green compact of the powder of said composite chemical composition;
    (d) heating said green compact for about 2 to about 60 minutes in a protective atmosphere at a temperature of about 550°–750° C.; and
    (e) working the thus heated compact within said temperature range to substantially 100% theoretical density.

8. A process as in claim 7 wherein the material selected from said group is copper.

9. A process as in claim 7 wherein the composite contains about 20 to 50 weight percent copper, balance nickel-iron alloy containing about 32 to 40 weight percent nickel.

10. A process as in claim 7 wherein the metal powder employed in the process has an average particle size of about 44–200 micrometers.

11. A process as in claim 7 wherein the green compact and the final product are produced by rolling.

12. A process as in claim 7 wherein said protective atmosphere is a reducing atmosphere.

* * * * *